United States Patent
Hadizad

(10) Patent No.: US 7,087,472 B2
(45) Date of Patent: Aug. 8, 2006

(54) METHOD OF MAKING A VERTICAL COMPOUND SEMICONDUCTOR FIELD EFFECT TRANSISTOR DEVICE

(75) Inventor: Peyman Hadizad, Scottsdale, AZ (US)

(73) Assignee: Semiconductor Components Industries, L.L.C.

( * ) Notice: Subject to any disclaimer, the term of this patent is extended or adjusted under 35 U.S.C. 154(b) by 83 days.

(21) Appl. No.: 10/623,392

(22) Filed: Jul. 18, 2003

(65) Prior Publication Data

US 2005/0014337 A1    Jan. 20, 2005

(51) Int. Cl.
*H01L 21/337* (2006.01)

(52) U.S. Cl. .................. 438/186; 438/268; 438/270

(58) Field of Classification Search ................ 438/242, 438/259, 270, 271, 272, 268, 212, 209, 186
See application file for complete search history.

(56) References Cited

U.S. PATENT DOCUMENTS

| | | | |
|---|---|---|---|
| 4,262,296 A | | 4/1981 | Shealy et al. |
| 4,835,586 A | * | 5/1989 | Cogan et al. ................ 257/260 |
| 4,893,160 A | * | 1/1990 | Blanchard .................. 257/334 |
| 4,914,058 A | * | 4/1990 | Blanchard .................. 438/270 |
| 5,108,783 A | * | 4/1992 | Tanigawa et al. ........... 438/359 |
| 5,231,037 A | | 7/1993 | Yuan et al. |
| 5,350,934 A | * | 9/1994 | Matsuda ..................... 257/139 |
| 5,602,405 A | * | 2/1997 | Terasawa .................... 257/136 |
| 5,610,085 A | | 3/1997 | Yuan et al. |
| 6,084,268 A | * | 7/2000 | de Fresart et al. .......... 257/342 |
| 6,229,197 B1 | * | 5/2001 | Plumton et al. ............ 257/627 |
| 6,335,247 B1 | * | 1/2002 | Tews et al. ................. 438/270 |
| 6,356,059 B1 | | 3/2002 | Yu |
| 6,380,569 B1 | * | 4/2002 | Chang et al. ............... 257/256 |
| 6,573,534 B1 | * | 6/2003 | Kumar et al. ................. 257/77 |
| 6,686,244 B1 | * | 2/2004 | Blanchard .................. 438/268 |
| 6,707,095 B1 | * | 3/2004 | Chidambarrao et al. .... 257/302 |
| 6,750,104 B1 | * | 6/2004 | Blanchard et al. .......... 438/268 |
| 6,777,722 B1 | * | 8/2004 | Yu et al. ..................... 257/134 |
| 2004/0157384 A1 | * | 8/2004 | Blanchard .................. 438/197 |
| 2005/0032280 A1 | * | 2/2005 | Yanagisawa ................ 438/138 |

FOREIGN PATENT DOCUMENTS

EP    0874394    10/1998

* cited by examiner

*Primary Examiner*—Hien-Ming Lee
*Assistant Examiner*—Khiem Nguyen
(74) *Attorney, Agent, or Firm*—Kevin B. Jackson

(57) ABSTRACT

In one embodiment, a method for fabricating a compound semiconductor vertical FET device includes forming a first trench in a body of semiconductor material, and forming a self-aligned second trench within the first trench to define a channel region. A doped gate region is then formed on the sidewalls and the bottom surface of the second trench. Source regions are formed on opposite sides of the trench structure. Localized gate contact regions couple individual doped gate regions together. Contacts are then formed to the localized gate contact regions, the source regions, and an opposing surface of the body of semiconductor material. The method provides a compound semiconductor vertical FET structure having enhanced blocking capability.

18 Claims, 5 Drawing Sheets

METHOD OF MAKING A VERTICAL COMPOUND SEMICONDUCTOR FIELD EFFECT TRANSISTOR DEVICE

RELATED APPLICATION

This application is further related to co-pending U.S. patent application Ser. No. 10/623,397, entitled "VERTICAL COMPOUND SEMICONDUCTOR WIELD EFFECT TRANSISTOR STRUCTURE", by Peyman Hadizad, assigned to the same assignee, Semiconductor Components Industries, LLC, filed concurrently herewith, and which is incorporated by reference for all purposes.

This application is related to co-pending U.S. patent application Ser. No. 10/623,390, entitled "DC/DC CONVERTER WITH DEPLETION MODE COMPOUND SEMICONDUCTOR FIELD EFFECT TRANSISTOR SWITCHING DEVICE", by Peyman Hadizad, assigned to the same assignee, Semiconductor Components Industries, LLC, filed concurrently herewith, and which is incorporated by reference for all purposes.

BACKGROUND OF THE INVENTION

This invention relates generally to high frequency power semiconductor device processing, and more specifically to methods for making vertical compound semiconductor field effect transistor (FET) devices.

In the area of computer and peripheral power supply applications, there are several factors driving future performance and demand. Such factors include an increase in output power requirements because of higher microprocessor speeds, smaller system size (i.e., reduced circuit board space), lower cost, improved transient response, and lower output voltage ripple (i.e., lower microprocessor operating voltages). Additionally, advancing microprocessor needs, which include decreasing operating voltage and increasing current requirements, will require power conversion devices and circuits that enable highly efficient and tightly regulated power. These devices and circuits must operate at higher frequencies and exhibit enhanced thermal characteristics.

Most losses in high frequency switching power circuits are determined by the physical properties of semiconductor devices, such as diodes, FETs, and insulated gate bipolar transistors. Although silicon based MOSFET devices are a primary choice for many power conversion applications, they have inherent limitations for high frequency applications due to their physical structure. Such limitations include high reverse recovery charge, high gate charge, gate resistance, and high on resistance, which detrimentally impact power dissipation and thermal response characteristics.

Unlike silicon, GaAs is a direct bandgap compound semiconductor material with an inherent property of high electron mobility (8500 $cm^2$/V-sec), which is greater than 4× that of silicon (1500 $cm^2$/V-sec). Also, GaAs has a larger bandgap of 1.42 eV compared to 1.1 eV for silicon, which provides, among other things, enhanced performance at elevated temperatures. Additionally, the reverse recovery charge of a GaAs FET device is approximately 100× lower than that of a silicon FET device. These properties make it an ideal candidate for high frequency applications as well as applications where thermal response characteristics are important.

Several vertical compound semiconductor FET devices have been reported. For example, U.S. Pat. Nos. 5,231,037 and 5,610,085 by H. T. Yuan et al. and assigned to Texas Instruments, Inc., both show vertical FET devices having a buried p-type gate structure covered by an n-type epitaxial overgrowth layer. One problem with the Yuan devices is that defects can be introduced in the epitaxial overgrowth layer during epitaxial growth, which results in a FET device having high leakage currents and low blocking gain. Additionally, the '037 and '085 structures are costly to manufacture.

In U.S. Pat. No. 4,262,296 by Shealy et al. and assigned to General Electric Company, a trapezoidal groove Schottky metal gate vertical FET is described. The Shealy design has several problems including high leakage caused by the Schottky gate, which results in low blocking gain. Additionally, a complementary etch profile in the orthogonal crystal directions lowers blocking gain as well.

In European Patent Application EP0874394, a method for making vertical FET is disclosed. In '394, the gate region is located at the bottom of a single etched trench. One problem with the '394 method is that it places the gate region in poor proximity to the channel, and the gate region has limited extension along the channel. These shortcomings result in a FET device with low blocking gain.

Accordingly, a need exists for a method of manufacturing vertical FET devices that have improved blocking gain, lower gate capacitance, and lower on resistance. Additionally, it would be beneficial for the method to support high volume manufacturing and to be cost effective.

DETAILED DESCRIPTION OF THE DRAWINGS

In general, the present invention pertains to a method for forming a vertical compound semiconductor field effect transistor (FET) device. In a preferred embodiment, a double trench gate region is formed in an upper surface of an n-type conductivity GaAs layer, which defines a channel region. The second trench is formed to provide a tightly spaced gate design. The gate region is then doped by ion implanting a p-type dopant species such as $Be^+$ into the lower sidewalls and bottom surface of the second trench. N-type source regions are formed on both sides of the double trench gate region. The opposite surface of the n-type conductivity GaAs layer provides a drain region. The doped gate region extends along the channel region and is separated from the source regions to provide, among other things, an improved gate blocking characteristic. A gate-coupling region is used to connect a plurality of closely spaced doped gate regions.

The present invention is better understood by referring to FIGS. 1–12 together with the following detailed description. For ease of understanding, like elements or regions are labeled the same throughout the detailed description and FIGURES where appropriate. The method according to the present invention is described using an n-channel vertical FET. As those skilled in the art will appreciate, the method is suitable for p-channel devices as well.

Figure 1:
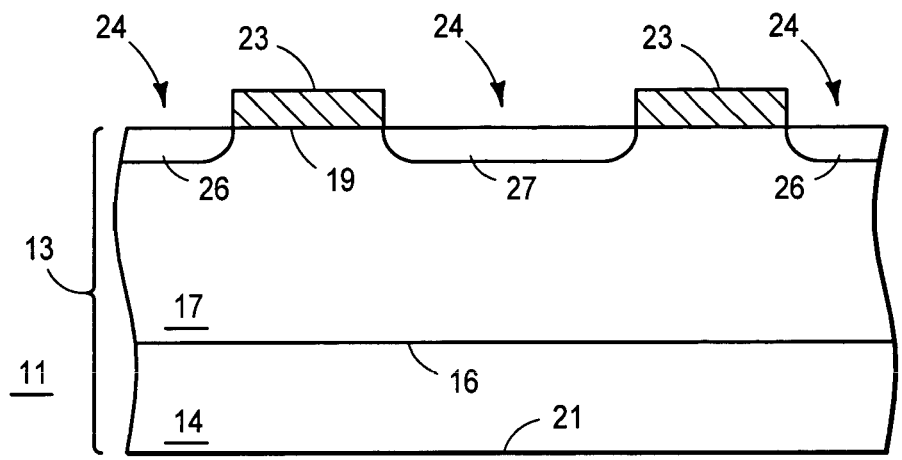
FIGS. 1–9 illustrate, enlarged cross-sectional views of a vertical FET device formed according to the present invention at various stages of fabrication.

FIG. 1 illustrates an enlarged cross-sectional view of a vertical field effect transistor (FET) device or structure or compound semiconductor vertical FET device 11 at an early stage of fabrication. Structure 11 comprises a body of semiconductor material 13, which preferably includes a starting or supporting substrate or wafer 14 having an upper surface 16. An epitaxial or drift layer or layers 17 is formed on upper surface 16. Body of semiconductor material 13 includes an upper surface 19 and a lower or opposing surface 21. Preferably, body of semiconductor material 13 comprises a compound semiconductor such as GaAs, InP or the like. Although only a portion of a FET device is shown, structure 11 preferably comprises a plurality of individual vertical FET devices connected in parallel. Each of the plurality of devices includes a gate structure, a source region, and a drain region.

In a preferred embodiment, substrate 14 comprises n-type GaAs, and layer 17 comprises an n-type GaAs epitaxial layer. The thickness and dopant concentration of layer 17 varies as a function of the desired device characteristics. For example, for a typical FET device suitable for a greater than 5 volt application, layer 17 has a dopant concentration on the order of less than $5 \times 10^{17}$ atoms/cm$^3$ and a thickness greater than about 0.1 microns. Layer 17 is formed using conventional compound semiconductor epitaxial growth methods. The dopant profile of layer 17 is substantially constant, or the profile is graded depending on desired device characteristics.

Next, a masking, passivation, or dielectric layer 23 is formed or deposited on body of semiconductor material 13. Layer 23 provides a means for defining regions for subsequent processing. Preferably, layer 23 comprises a silicon nitride film deposited using plasma-enhanced chemical vapor deposition (PECVD). A thickness on the order of about 0.05 microns to about 0.3 microns is suitable. Layer 23 is then patterned using conventional photolithography and reactive ion etch (RIE) techniques to provide a plurality of openings 24. Preferably, a patterned resist layer (not shown) is left on layer 23 until after a dopant incorporation step, which is described next.

Source regions 26 and doped region 27 are formed through openings 24 in upper surface 19, and are spaced apart from each other. When layer 17 comprises an n-type material, source regions 26 comprise n+ regions and preferably are formed using ion implantation techniques. For example, source regions 26 and doped region 27 are formed using Si$^+$ implantation at a dose sufficient to lower contact resistance to subsequently formed contact layers. For example, a Si$^+$ dose of about $4.0 \times 10^{13}$ atoms/cm$^2$ with an implant energy on the order of 85 KeV being typical. Alternatively, selenium, tin, or tellurium is used to form source regions 26 and doped region 27. In an alternative embodiment, multiple source implants at different implant doses and implant energies are used.

Figure 2:
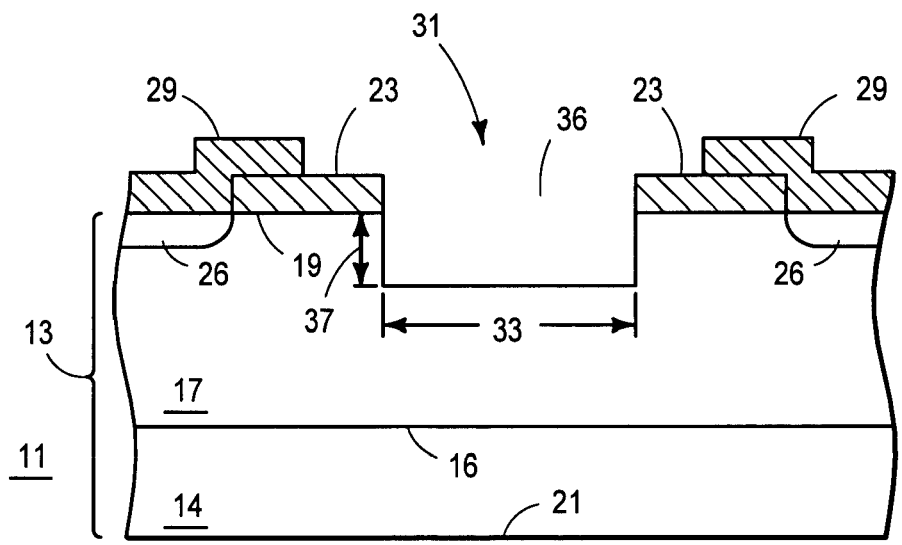

Next as shown in FIG. 2, which is an enlarged cross-sectional view of structure 11 at a subsequent step of fabrication, a second masking, passivation, or dielectric layer 29 is formed over exposed surfaces of body of semiconductor material 13 and layer 23. Layer 29 is then patterned using conventional photolithography and reactive ion etching techniques to provide a first trench opening 31 having a width 33. Layer 29 comprises, for example, a silicon nitride layer, which preferably is formed using plasma-enhanced CVD, and has a thickness on the order of 0.05 microns to 0.3 microns.

First trench or groove 36 is then formed in body of semiconductor material 13 through opening 31 and extending from upper surface 19. Trench 36 preferably is formed using reactive ion etching (RIE) or damage free electron cyclotron resonance (ECR) etching, which provides clean and substantially straight sidewall features. A chlorine-based etch chemistry is preferred. Preferably, first trench 36 is between a pair of source regions 26 as shown.

Preferably, trench 36 has a width 33 from about 0.3 microns to about 1.5 microns, and a depth 37 in range from about 0.5 microns to about 5 microns. These dimensions are variable according to specific device requirements. Preferably, a resist layer (not shown) used to pattern layer 29 and form opening 31 is left in place until after trench 36 is formed, and then removed to provide the structure shown in FIG. 2.

Figure 3:
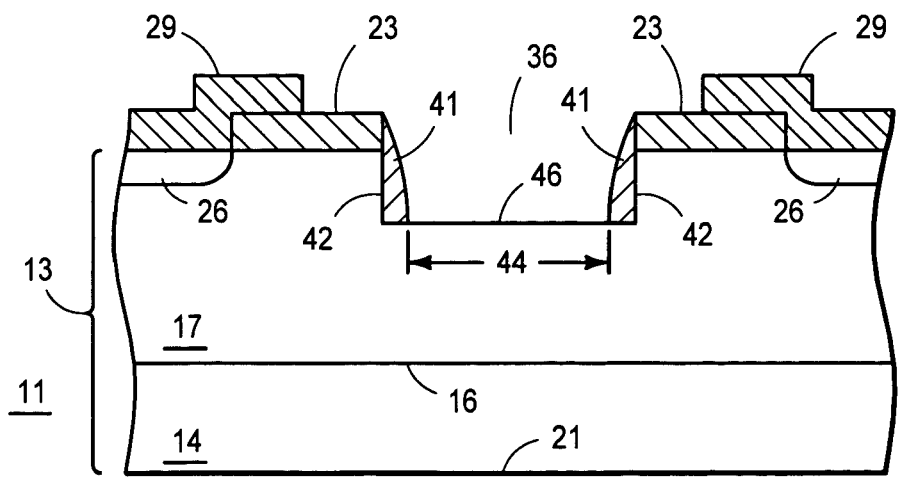

FIG. 3 shows structure 11 at a later stage of fabrication after spacers 41 are formed on sidewalls 42 of first trench 36. Spacers 41 preferably comprise a low temperature deposited silicon oxide, and are formed using conventional etch-back spacer formation techniques. Specifically, a spacer layer is deposited over body of semiconductor material 13, and has thickness based on width 33, depth 37, and desired width 44 of opening 46. After the spacer layer is deposited, an etch-back step is used to form spacers 41, which provide opening or self-aligned feature 46.

Figure 4:
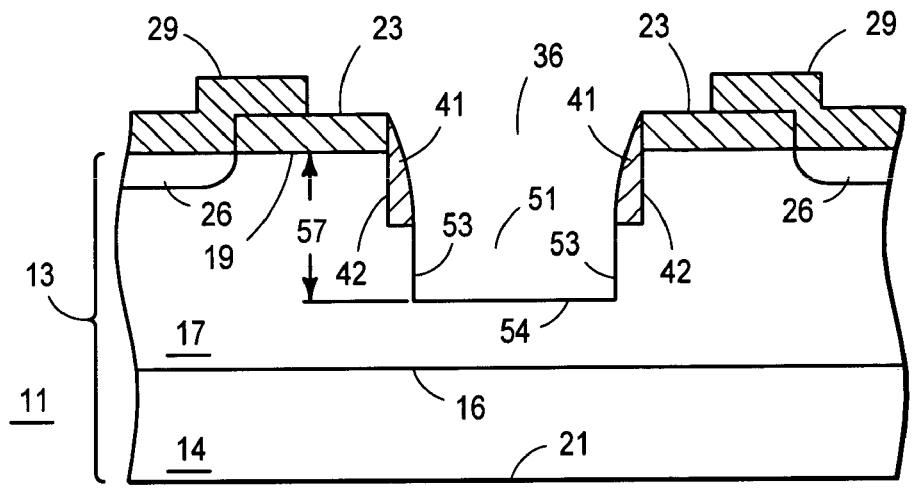

Next as shown in FIG. 4, a second trench or groove 51 is formed in body of semiconductor material 13 within trench 36. Trench 51 preferably is formed using RIE or ECR etching techniques to provide clean and substantially straight sidewalls or side surfaces 53 and bottom surface 54. Trench 51 extends a distance 57 from upper surface 19, which is determined by desired device characteristics. For example, for a greater than 5 volt vertical FET device, distance 57 is in a range from about 0.5 microns to about 5 microns.

Figure 5:
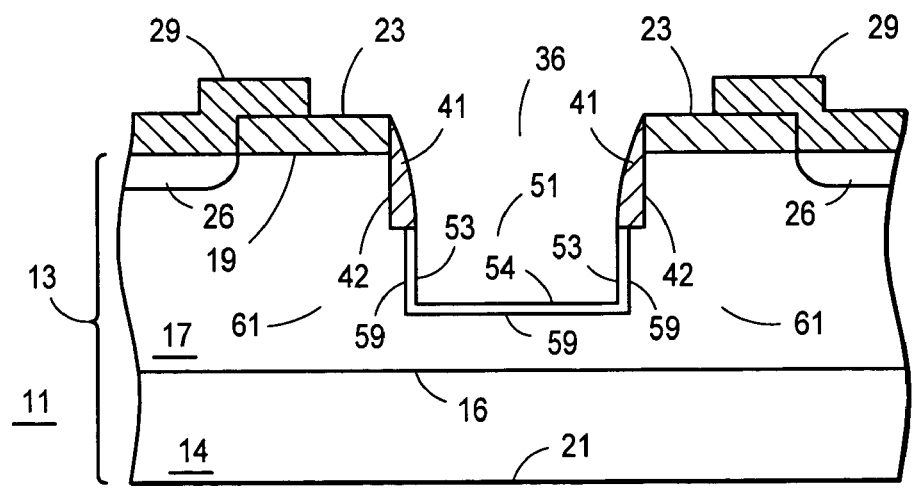

FIG. 5 is an enlarged cross-sectional view of structure 11 after a doped gate region or gate region 59 is formed along at least a portion of sidewalls 53 and bottom surface 54. In the preferred embodiment described herein, gate region 59 comprises a p type dopant, and is formed using ion implantation techniques. Preferably, a dopant species such as beryllium or carbon is used to achieve a p-region depth of about 0.25 microns to about 1.5 microns. To form gate region 59 on sidewalls 53, structure 11 or the implant beam is angled at up to approximately 45 degrees during implantation. Preferably, gate region 59 extends up or covers substantially all of sidewalls 53.

Alternatively, gate region 59 is formed using angled co-implantation of carbon with either an electrically inactive species or an electrically active species. More specifically, an electrically inactive species such as argon or krypton is co-implanted into sidewalls 53 and bottom surface 54 when body of semiconductor material 13 or layer 17 comprise GaAs. The electrically inactive species causes lattice damage (i.e., vacancies), and thus, allows co-implanted carbon to diffuse more rapidly in the GaAs lattice structure.

Alternatively, an electrically active species is co-implanted into sidewalls 53 and bottom surface 54. For example, when body of semiconductor material 13 comprises of GaAs, an electrically active species such as aluminum, gallium or indium is used. These species also induce lattice damage allowing the co-implant to enhance carbon activation.

By using second trench 51, gate region 59 is deeper into channel regions 61 and more separated from source regions 26 thereby improving gate blocking characteristics. Also, by using a doped gate region, the blocking characteristics are further improved compared to conventional Schottky gate designs. Additionally, by using a preferred self-aligned second trench formation step, a plurality of doped gate regions 59 are placed close together thereby improving device performance.

Figure 6:
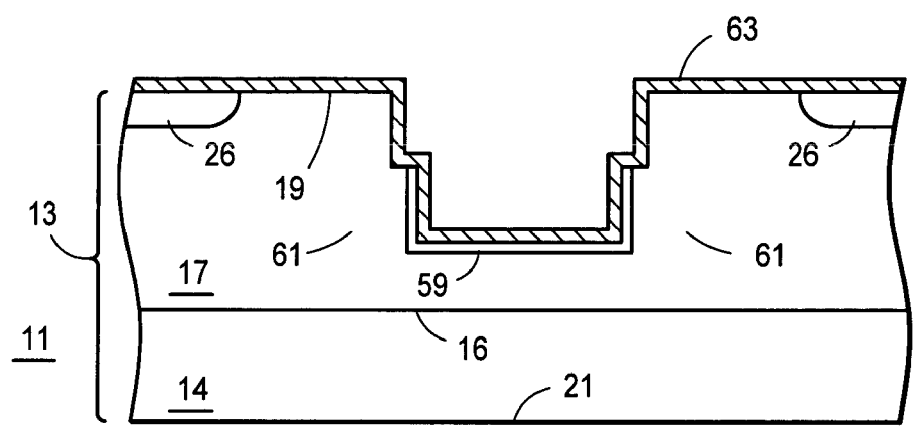

FIG. 6 shows structure 11 at a further step of fabrication after passivation layers 23 and 29 have been removed, and a passivation layer 63 has been deposited on body of semiconductor material 13. Preferably, passivation layer 63 comprises a silicon nitride layer deposited using plasma-enhanced CVD. Passivation layer 63 preferably has a thickness on the order of about 0.05 to about 0.3 microns. Source regions 26 and gate region 59 are then simultaneously annealed to active the implanted dopant species. For example, these regions are annealed at temperatures up to 900° C. for about 10 to 30 seconds.

Figure 7:
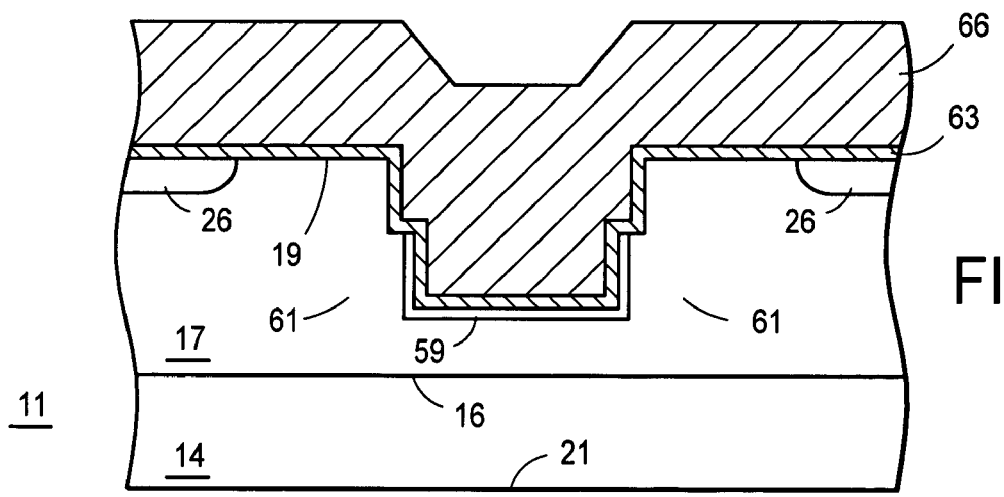
Figure 8:
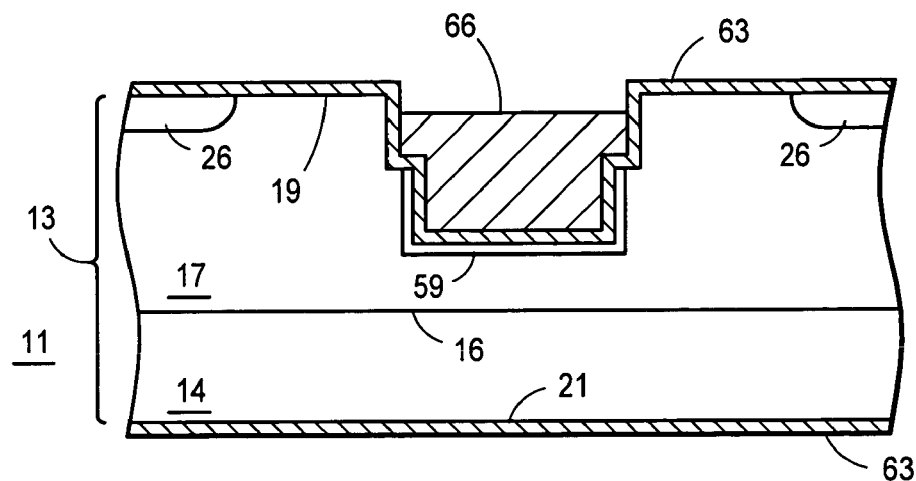

Next as shown in FIG. 7, a trench fill or passivation layer 66 is deposited on passivation layer 63. Trench fill layer 66 preferably comprises a deposited silicon oxide, a deposited silicon nitride, or a spin-on dielectric, and has a thickness sufficient to overfill first trench 36 and second trench 51. An etch back step is then used to planarize trench fill layer 66. Trench fill layer 66 is etched back to a thickness so as to provide for sufficient step coverage for subsequently formed contact layers. Preferably, trench fill layer 66 is etched back so that its upper surface is below upper surface 19 as shown in FIG. 8. Alternatively, trench fill layer 66 is planarized using chemical mechanical planarization techniques.

Figure 9:
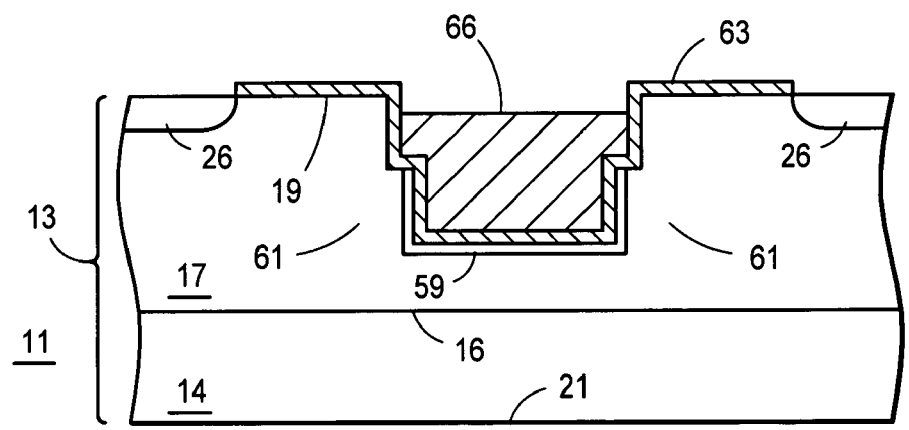

FIG. 9 shows structure 11 after passivation layer 63 is patterned using conventional photolithography and reactive ion etching techniques to expose portions of source regions 26. Additionally, portions of trench fill layer 66 and passivation layer 63 are removed to expose portions of a gate connecting region (shown in FIG. 10).

Figure 10:
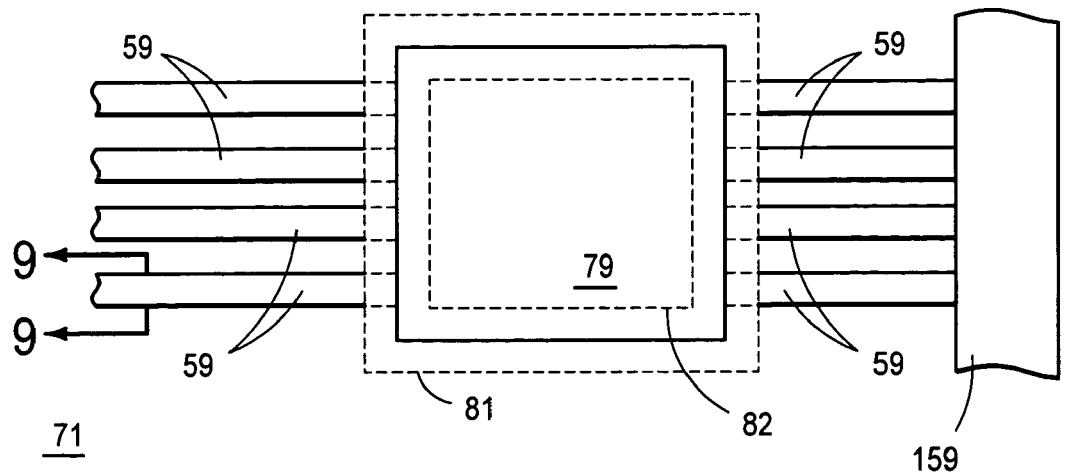
FIG. 10 is a partial top plan view of a gate contact structure formed according to the present invention.

FIG. 10 is a partial top plan view of a preferred gate contact structure 71, which includes doped gate connecting region 79. Doped gate connecting region 79 ties or couples together a plurality of doped gate regions 59 in a single contact region. For ease of understanding, structure 11 shown in FIG. 9 is taken along reference line 9—9. Phantom lines 81 and 82 represent alternative edge placements for a gate contact region. Doped termination region 159 is part of a preferred termination structure, which is described in FIG. 12.

Gate structure 71 allows individual doped gate regions 59 to be placed closer together by providing a centralized contact region. This allows gate contact regions 59 to extend along channels 61, which improves gate blocking capability. For a finished vertical FET device according to the present invention, a plurality of gate contact structures 71 is used, with each gate structure preferably spaced about every 25 to 100 microns. This spacing is variable depending on space requirements and desired device characteristics.

Figure 11:
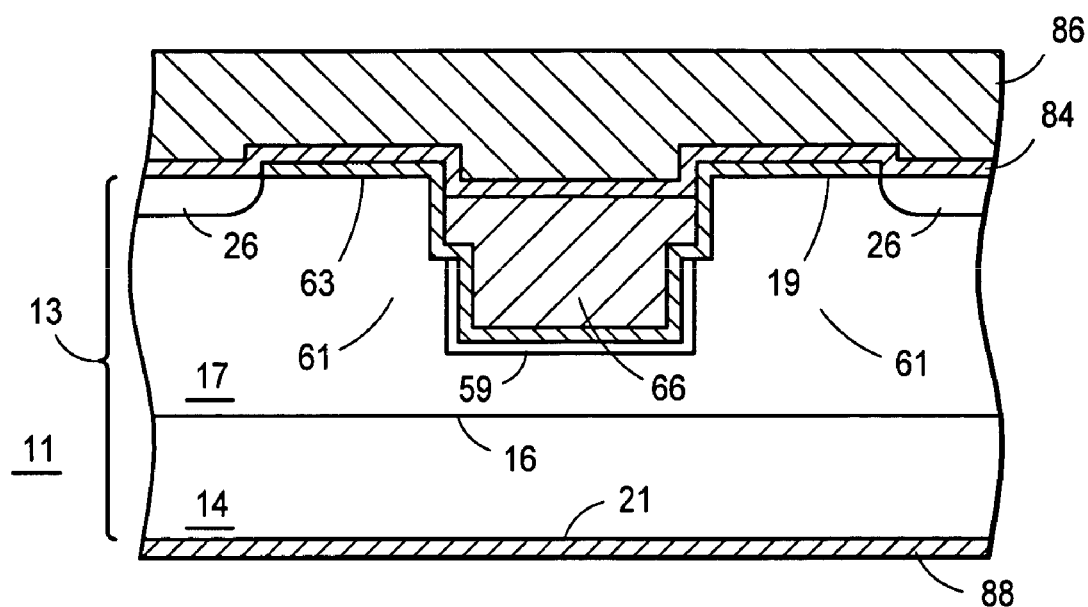
FIG. 11 illustrates an enlarged cross-sectional view of the vertical FET device formed according to the present invention at a final stage of fabrication.

FIG. 11 shows a cross-sectional view of structure 11 near a final stage of fabrication. A first contact or metal layer 84 is deposited over upper surface 19, and then patterned using conventional techniques. By way of example, first contact layer 84 comprises NiGeAu, NiGeW or other suitable metal to form source contacts. Next, a second contact or metal layer 86 is deposited or plated over first contact layer 84 to provide, among other things, improved contact resistance. Second metal layer 86 comprises nickel or gold, and is deposited using, for example, electroplating or electroless plating techniques.

A back-grind or wafer thinning step is used to decrease the thickness of body of semiconductor material 13 to, among other things, reduce series resistance. A metal layer 88 is then deposited on the lower surface 21. Metal layer 88 comprises NiGeAu, or another suitable metal, and forms a drain contact for structure 11.

Figure 12:
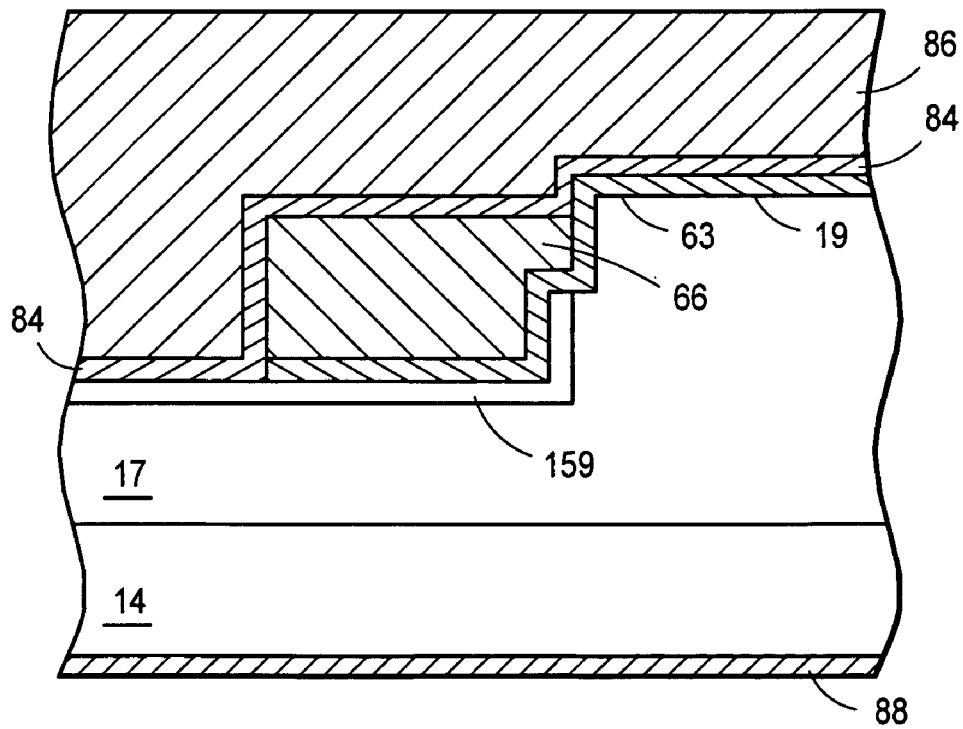
FIG. 12 illustrates an enlarged cross-sectional view of an edge termination structure formed according to the present invention.

FIG. 12 shows an enlarged cross-sectional view of a preferred edge termination structure 91 for vertical FET device 11. Structure 91 includes a p-type termination region 159 that is formed at the same time as doped gate region 59. Termination structure 91 provides a means for controlling electric field spread and electric field shape during device operation, and is coupled to doped gate connecting region 79 as shown in FIG. 10.

Thus it is apparent that there has been provided, in accordance with the present invention, a method for forming a vertical compound semiconductor FET device. A self-aligned trench within a trench gate method provides a FET device with improved gate blocking characteristics. Additionally, the FET device has improved high frequency performance characteristics compared to conventional silicon FET devices including enhanced mobility, improved reverse recovery, lower on resistance, and reduced gate charging effects.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

I claim:

1. A method of making a semiconductor device comprising the steps of:

providing a body of semiconductor material comprising a first conductivity type, wherein the body of semiconductor material has an upper surface and a lower surface opposing the upper surface, wherein a portion of the body of semiconductor material forms a drain region, and wherein the lower surface provides a drain contact;

forming a first trench in the body of semiconductor material and extending from the upper surface, wherein the first trench has a first width, a first depth from the upper surface, first sidewalls, and a first bottom surface;

forming a second trench within the first trench, wherein the second trench has a second width, a second depth from the first surface, second sidewalls and a second bottom surface;

forming a first source region in the body of semiconductor material extending from the upper surface and spaced apart from the first trench by a portion of the body of semiconductor material;

introducing a dopant of a second conductivity type into at least a portion of the second sidewalls and the second bottom surface to form a doped trench gate region, wherein the doped trench gate region extends into the body of semiconductor material for controlling conduction in the device and wherein the drain region, the first source region, and the doped trench gate region form a vertical juntion FET device;

forming a first passivation layer over the doped trench gate region; and forming a second passivation layer over the first passivation layer thereby filling at least the second trench.

2. The method of claim 1 wherein the step of providing the body of semiconductor material comprises providing a III–V semiconductor substrate having a first dopant concentration and a first epitaxial layer formed on a surface of the semiconductor substrate, wherein the first epitaxial layer has a second dopant concentration less than the first dopant concentration.

3. The method of claim 1 wherein the step of providing the body of semiconductor material comprises providing a body of semiconductor material comprising GaAs.

4. The method of claim 1 wherein the step of forming the second trench comprises the steps of:
depositing a spacer layer over the upper surface and the first trench;
etching back the spacer layer to form spacers that cover first sidewalls and a portion of the first bottom surface leaving a selfaligned opening in the spacer layer to expose a remaining portion of the bottom surface; and
etching the second trench through the opening.

5. The method of claim 1 wherein the step of introducing the dopant of the second conductivity type comprises implanting the dopant into the second sidewalls and the second bottom surface.

6. The method of claim 5 wherein the step of implanting the dopant species includes implanting one of beryllium and carbon.

7. The method of claim 1, wherein the step of forming the second passivation comprises the steps of:
depositing a dielectric material over the first passivation layer; and
planarizing the dielectric material to form the second passivation layer.

8. The method of claim 1 further comprising the step forming a second source region in the body of semiconductor material spaced apart from the first trench by another portion of the body of semiconductor material, wherein the first trench is between the first and second sources.

9. The method of claim 1 wherein the step of forming the first trench includes etching the first trench using one of reactive ion etching and electron cyclotron resonance etching.

10. The method of claim 1 wherein the step of forming the second trench includes etching the second trench using one of reactive ion etching and electron cyclotron resonance etching.

11. A process for making a compound semiconductor device comprising the steps of:
forming a first groove in a compound semiconductor layer of a first conductivity type, wherein the first groove has first sidewalls and a first lower surface, and wherein the first groove extends from a first surface of the compound semiconductor layer;
forming a second groove within the first groove, wherein the second groove has second sidewalls and a second lower surface;
doping the second lower surface and at least a portion of the second sidewalls with a second conductivity type dopant to form a doped trench gate region in the compound semiconductor layer for controlling conduction in the device;
forming a first source region of the first conductivity type in the compound semiconductor layer adjacent to the first groove;
forming a source contact to the first source region;
filling the second groove and at least a portion of the first groove with a passivation layer;
forming a gate contact coupled to the doped trench gate region; and
forming a drain contact on a second surface of the compound semiconductor layer to form a vertical doped trench gate compound semiconductor juntion FET device.

12. The process of claim 11 wherein the step of forming the first groove includes forming the first groove in a compound semiconductor layer comprising one of GaAs and InP.

13. The process of claim 11 wherein the step of doping the second lower surface and at least a portion of the second sidewalls includes ion implanting a second conductivity type dopant species.

14. The process of claim 11 wherein the step of forming the second groove comprises the steps of:
forming spacers on the first sidewalls leaving an opening over the first lower surface; and
etching the second groove in the compound semiconductor through the opening.

15. The process of claim 11 wherein the steps of forming the first and second grooves including forming first and second grooves having substantially straight sidewall surfaces.

16. A method for forming a compound semiconductor device comprising the steps of:
providing a body of compound semiconductor material including a support wafer of a first conductivity type and a first dopant level and an epitaxial layer formed over the support wafer, wherein the epitaxial layer is of the first conductivity type and has a second dopant level lower than the first dopant level;
forming a plurality of spaced apart first doped regions of the first conductivity type in the epitaxial layer;
forming a plurality of first trenches in the epitaxial layer, wherein each first trench is between a pair of first doped regions;
forming a plurality of second trenches in the epitaxial layer, wherein one second trench is within one first trench;
doping at least portions of sidewall surfaces and lower surfaces of each second trench to form a plurality of doped trench gate regions, wherein the plurality of doped gate regions extend into the body of compound semiconductor material and are configured for controlling current conduction in the device;
filling the plurality of second trenches and a least a portion of the plurality of first trenches with a passivation material;
coupling the plurality of spaced apart first doped regions with a first contact layer;
coupling the plurality of doped trench gate regions to a gate connecting region formed in the body of compound semiconductor material; and
forming a drain contact on a lower surface of the support wafer to form a vertical trench gate compound semiconductor juntion FET device.

17. The method of claim 16 of providing the body of compound semiconductor material includes providing a body of compound semiconductor material comprising one of GaAs and InP.

18. The method of claim 16 wherein the step of doping the sidewall surfaces and lower surfaces includes ion implanting a dopant of the second conductivity type.

* * * * *